(12) United States Patent
Okuaki

(10) Patent No.: US 9,510,488 B2
(45) Date of Patent: Nov. 29, 2016

(54) MOTOR DRIVE UNIT WITH HEAT SINK DEALING WITH DROP OF CUTTING FLUID

(71) Applicant: FANUC Corporation, Minamitsuru-gun, Yamanashi (JP)

(72) Inventor: Kenichi Okuaki, Minamitsuru-gun (JP)

(73) Assignee: FANUC Corporation, Minamitsuru-gun, Yamanashi (JP)

( * ) Notice: Subject to any disclaimer, the term of this patent is extended or adjusted under 35 U.S.C. 154(b) by 0 days.

(21) Appl. No.: 14/543,940

(22) Filed: Nov. 18, 2014

(65) Prior Publication Data

US 2015/0146374 A1 May 28, 2015

(30) Foreign Application Priority Data

Nov. 27, 2013 (JP) .................................. 2013-245209

(51) Int. Cl.
*H05K 7/20* (2006.01)

(52) U.S. Cl.
CPC ...... *H05K 7/20909* (2013.01); *H05K 7/20863* (2013.01)

(58) Field of Classification Search
None
See application file for complete search history.

(56) References Cited

U.S. PATENT DOCUMENTS

| | | | | |
|---|---|---|---|---|
| 4,103,737 A * | 8/1978 | Perkins | ................. | H01L 23/467 165/109.1 |
| 5,077,601 A * | 12/1991 | Hatada | ................. | H01L 23/467 165/80.3 |
| 5,957,194 A * | 9/1999 | Azar | ........................ | F28F 3/02 165/185 |
| 6,504,714 B1 * | 1/2003 | Richter | .............. | H05K 7/20572 361/695 |
| 7,177,148 B2 * | 2/2007 | Nakata | ..................... | H02B 1/28 174/16.1 |
| 7,180,740 B2 * | 2/2007 | Li | ......................... | H01L 23/467 165/80.3 |
| 8,432,686 B2 * | 4/2013 | Liu | ......................... | G06F 1/187 361/679.49 |
| 8,897,011 B2 * | 11/2014 | Kwak | ................... | H01L 23/473 165/80.4 |
| 9,084,376 B2 * | 7/2015 | Weiss | ................. | H05K 7/20163 |
| 2007/0045306 A1 * | 3/2007 | Hirano | .............. | H05K 7/20172 219/757 |
| 2011/0198973 A1 * | 8/2011 | Hirano | .............. | H05K 7/20172 312/236 |
| 2015/0146374 A1 * | 5/2015 | Okuaki | ............. | H05K 7/20909 361/690 |

FOREIGN PATENT DOCUMENTS

JP   2005-321287 A   11/2005
JP   2007-048946 A   2/2007

OTHER PUBLICATIONS

Notification of Reasons for Refusal dated Feb. 17, 2015 in corresponding Japanese Patent Application No. 2013-245209 with English translation.

\* cited by examiner

*Primary Examiner* — Courtney Smith
(74) *Attorney, Agent, or Firm* — Drinker Biddle & Reath LLP

(57) ABSTRACT

A motor drive unit includes a housing in which a heat sink and at least one electronic component to be cooled by the heat sink are disposed. An end of the heat sink which is opposite to the electronic component is inclined relative to a horizontal plane so as to prevent a cutting fluid dropping from the heat sink from falling onto another electronic component located below the heat sink.

3 Claims, 6 Drawing Sheets

FIG. 2A
FIG. 2B
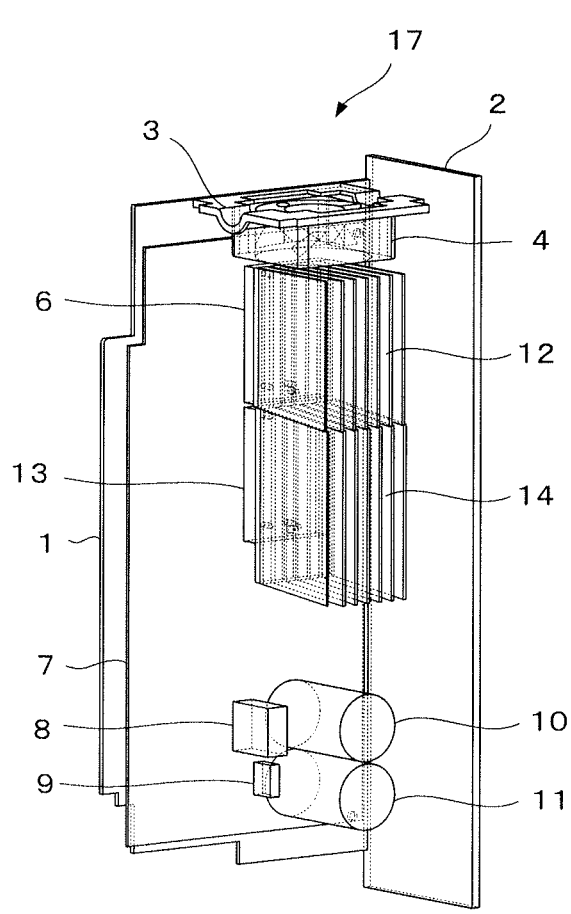
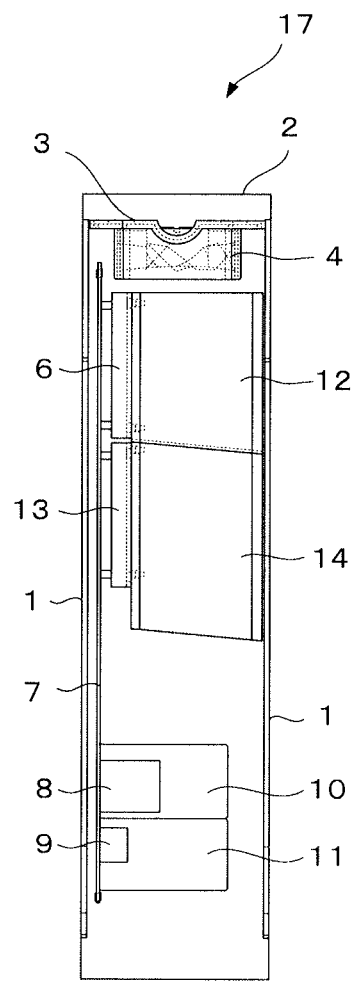

FIG. 3A
FIG. 3B
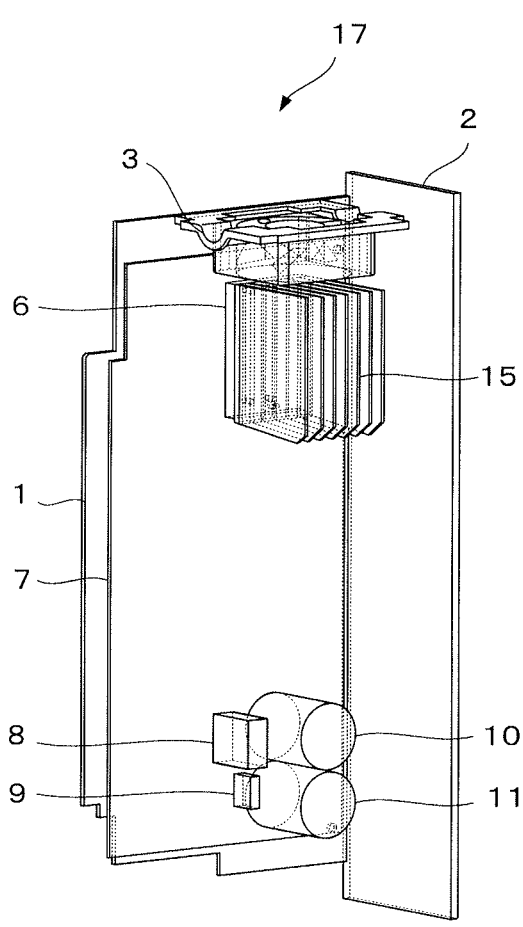
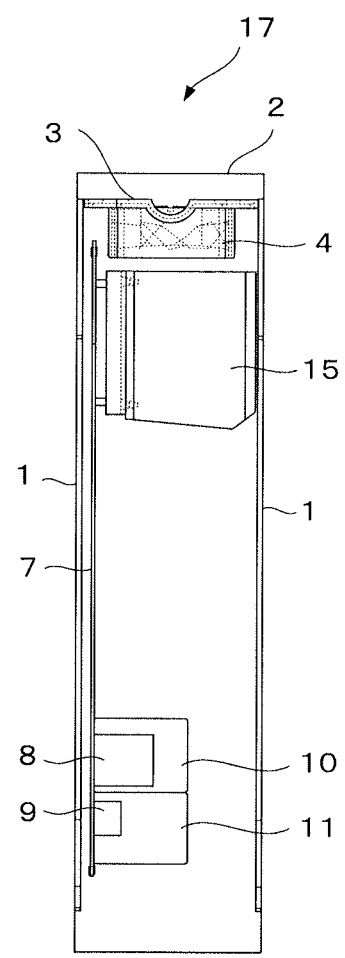

MOTOR DRIVE UNIT WITH HEAT SINK DEALING WITH DROP OF CUTTING FLUID

RELATED APPLICATION DATA

This application claims priority under 35 U.S.C. §119 and/or §365 to Japanese Application No. 2013-245209 filed Nov. 27, 2013, the entire contents is incorporated herein by reference.

BACKGROUND OF THE INVENTION

1. Field of the Invention

The present invention relates to a motor drive unit with a heat sink that cools a power device.

2. Description of the Related Art

Many motor drive unites include a heat sink with a plurality of fins and an air blower such as a fan motor in order to cool electronic components such as a power device (see Japanese Patent Application Laid-Open No. 2005-321287). FIG. 5A and FIG. 5B are perspective views of the appearance of a motor drive unit 17 according to a conventional technique. FIG. 6A and FIG. 6B are schematic diagrams of an internal configuration of the motor drive unit 17 according to the conventional technique. The motor drive unit includes a housing with a housing component 1, a housing component 2, and a housing component 3.

The motor drive unit is installed in a factory or the like so as to be mounted in an electric cabinet for a machine tool or the like. In an environment in the factory around the electric cabinet with the motor drive unit mounted therein, mist of cutting fluid or dust may float. When the electric cabinet is insufficiently closed, outside air containing mist of cutting fluid may infiltrate into the electric cabinet and further into the motor drive unit and adhere to electronic components to make the electronic components defective. In particular, when a fan motor is installed in order to cool the electronic components of the motor drive unit, the electronic components are likely to be defective.

Much mist of cutting fluid or the like may adhere to, for example, areas with a heat sink or the like where cooling air flows concentrically, resulting in droplets of the fluid. The droplets may fall concentrically onto electronic components near the heat sink to make the electronic components defective.

As a conventional measure against the droplets, the electronic components are disposed away from the heat sink and the like to which the droplets are likely to adhere, so as to be prevented from becoming defective as a result of falling droplets. However, the measure may disadvantageously limit the arrangement of the electronic components, making examination of the electronic component arrangement during a design phase difficult and leading to an increased size of a printed circuit board and thus of the motor drive unit. Furthermore, the electronic components disposed away from the heat sink may make patterns longer than necessary and become susceptible to noise. As a result, the electronic components may become defective.

SUMMARY OF THE INVENTION

To solve the above-described problems of the conventional technique, it is an object of the present invention to provide a motor drive unit with a heat sink dealing with drop of a cutting fluid, in which an end of the heat sink installed in the motor drive unit is inclined relative to a horizontal plane so that, when mist of cutting fluid infiltrating into the motor drive unit adheres to the heat sink to become a droplet, the unit enables a position onto which the droplet falls to be controlled to reduce adhesion of the droplet to an electronic component.

The motor drive unit according to the present invention includes a housing in which the heat sink and at least one electronic component to be cooled by the heat sink are disposed. The end of the heat sink opposite to the electronic component is inclined relative to the horizontal plane to prevent the cutting fluid dropping from the heat sink from falling onto another electronic component located below the heat sink.

An end of a surface of the heat sink on the side opposite to a surface thereof attached to the electronic component may be in proximity to or in contact with the housing.

Moreover, a part of the housing may be in contact with an electric cabinet.

The present invention can provide a motor drive unit with a heat sink dealing with drop of a cutting fluid, in which an end of the heat sink being installed in the motor drive unit is inclined relative to a horizontal plane so that, when mist of cutting fluid infiltrating into the motor drive unit adheres to the heat sink to become a droplet, the unit enables a position onto which the droplet falls to be controlled to reduce adhesion of the droplet to an electronic component.

BRIEF DESCRIPTION OF THE DRAWINGS

The above-described and other objects and features of the present invention will be apparent from the following description of embodiments with reference to the attached drawings in which:

FIG. 2A is a schematic perspective view depicting the internal structure of Embodiment 2 of the motor drive unit according to the present invention;

FIG. 2B is a schematic front view of the motor drive unit in FIG. 2A;

FIG. 3A is a schematic perspective view depicting the internal structure of Embodiment 3 of the motor drive unit according to the present invention;

FIG. 3B is a schematic front view of the motor drive unit in FIG. 3A;

DETAILED DESCRIPTION OF THE PREFERRED EMBODIMENTS

Figure 1A:
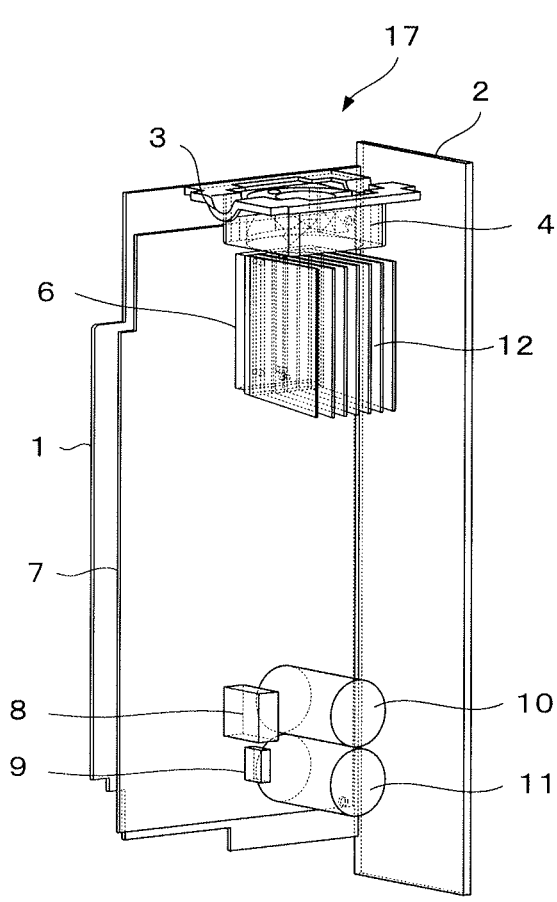
FIG. 1A is a schematic perspective view depicting the internal structure of Embodiment 1 of a motor drive unit according to the present invention.

Embodiments of the present invention will be described below with reference to the drawings. Components of the embodiments which are the same as or similar to the corresponding components according to the conventional technique will be described using the same reference numerals.

Figure 1B:
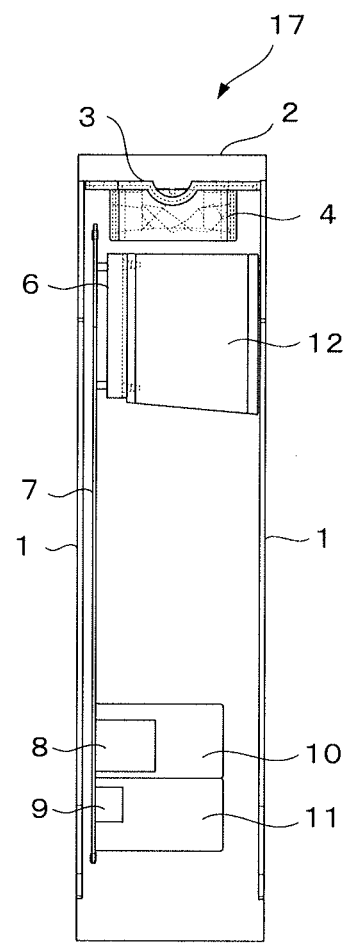
FIG. 1B is a schematic front view of the motor drive unit in FIG. 1A.

First, Embodiment 1 of a motor drive unit according to the present invention will be described with reference to FIG. 1A and FIG. 1B.

A motor drive unit 17 includes a housing with a first housing component 1, a second housing component 2, and a third housing component 3. A fan motor 4 is attached to the third housing component 3. A heat sink 12 is disposed in the housing near the fan motor 4. A printed circuit board 7 is provided along the first housing component 1. A power device 6 is attached to the printed circuit board 7. Furthermore, a heat sink 12 is fixed to the power device 6 in order to cool the power device 6. Electronic components 8, 9, 10, and 11 are disposed in an internal lower portion of the housing.

In Embodiment 1, an end of the heat sink 12 that cools the power device 6 mounted on the printed circuit board 7 is inclined to a direction perpendicular to a mounting surface of the power device 6. In other words, when the motor drive unit 17 is installed in an electric cabinet 16 (not depicted in the drawings), a vertical lower end of the heat sink 12 is inclined relative to a horizontal plane as depicted in FIG. 1B.

With the motor drive unit 17 installed in the electric cabinet 16, the end of the heat sink 12 installed in the motor drive unit 17 is inclined relative to the horizontal plane. Thus, droplets of a cutting fluid collected by the fan motor 4 and attached to the heat sink 12 can be caused to fall onto a side surface of the first housing component 1 of the motor drive unit 17 so as not to fall onto the electronic components 8, 9, 10, and 11 mounted closer to the ground than the heat sink 12.

A position onto which droplets fall down vertically from the heat sink 12 will be described. The motor drive unit 17 is attached inside the electric cabinet 16 so that the electronic components 8, 9, 10, and 11 are positioned below the heat sink 12 in the vertical direction. This state is hereinafter referred to as a normal usage state of the motor drive unit 17. In the orientation of the motor drive unit 17 in the normal usage state, the end of the heat sink 12 attached inside the housing of the motor drive unit 17, on the side opposite to the ground (the vertical lower end), is inclined relative to a horizontal plane. If an imaginary line is extended vertically downward from the vertical lowermost end of the end of the heat sink 12 inclined relative to the horizontal plane, the imaginary line crosses none of the 'electronic components 8, 9, 10, and 11 that are not resistant to the cutting fluid or the like'. Thus, the cutting fluid dropping from the vertical lowermost end (actually, an area including the lowermost end and the vicinity thereof) of the heat sink 12 can be prevented from falling onto the electronic components 8, 9, 10, and 11. The aforementioned 'electronic components that are not resistant to the cutting fluid or the like' include components having exposed live components such as a chip resistor and an IC and which are likely to suffer defects such as a short circuit or disconnection.

When the heat sink 12 is disposed in proximity to or in contact with a side surface of the first housing component 1, droplets flow from the heat sink 12 to the side surface of the first housing component 1. This enables a reduction in the adhesion of droplets to the 'electronic components 8, 9, 10, and 11 mounted closer to the ground than the heat sink 12' and to other units mounted closer to the ground than the motor drive unit 17.

The aforementioned 'electronic components 8, 9, 10, and 11 mounted closer to the ground than the heat sink 12' mean that, when the motor drive unit 17 with the heat sink 12 is installed in the electric cabinet 16 in the normal orientation, the electronic components 8, 9, 10, and 11 are positioned below the position of the heat sink 12 in the vertical direction. This also applies to the other embodiments (described below).

Variations of the heat sink 12 include a heat sink formed by extrusion, a heat sink formed of a heat receiving material including thin caulked fins in order to increase a heat radiation area, and a heat sink formed of a heat receiving material with thin fins joined thereto by brazing or soldering. However, the heat sink 12 is not limited to these variations. Furthermore, a possible material for the heat sink 12 may be a metal such as aluminum, an aluminum alloy, copper, or a copper alloy which has a high heat conductivity. However, the heat sink 12 is not limited to these materials.

Now, Embodiment 2 of the motor drive unit according to the present invention will be described with reference to FIG. 2A and FIG. 2B.

In Embodiment 2, a plurality of heat sinks 12 and 14 is mounted on a printed circuit board 7 in order to cool a plurality of power devices 6 and 13 mounted on the printed circuit board 7. A vertical lower end of each of the heat sinks 12 and 14 is inclined relative to a plane perpendicular to a surface of the printed circuit board 7 to which the power devices 6 and 13 are attached. Thus, with a motor drive unit 17 installed in an electric cabinet 16 in a normal orientation, the vertical lower end of each of the heat sinks 12 and 14 is inclined relative to a horizontal plane as is the case with Embodiment 1. Alternatively, a lower end of the upper heat sink 12 may be flush with a horizontal plane, and the heat sink 12 and the heat sink 14 may be disposed in proximity to or in contact with each other.

If the plurality of heat sinks 12 and 14 is mounted on the printed circuit board 7 in a manner such that they are arranged one above the other, droplets flow down through the upper heat sink 12 to the lower heat sink 14 and then fall from the lower heat sink 14. This enables a reduction in the adhesion of the droplets to electronic components 8, 9, 10, and 11 mounted closer to the ground. Furthermore, when the heat sinks 12 and 14 are disposed in proximity to or in contact with a side surface of the first housing component 1, droplets flow from the heat sinks 12 and 14 to the side surface of the first housing component 1. This enables a reduction in the adhesion of droplets to the electronic components 8, 9, 10, and 11 mounted closer to the ground than the heat sink 12 and 14.

Now, Embodiment 3 of the motor drive unit according to the present invention will be described with reference to FIG. 3A and FIG. 3B.

In Embodiment 3, an end of a heat sink 15 that cools a power device 6 mounted on a printed circuit board 7 is inclined in two directions relative to a horizontal plane, with the vertex between the two inclinations positioned in the middle of the end side of the heat sink 15.

The vertex between the inclinations at the end of the heat sink 15 is displaced from the position of the electronic components 8, 9, 10, and 11 mounted closer to the ground. This enables a reduction in the adhesion to the electronic components 8, 9, 10, and 11, of droplets falling from the heat sink 15. Thus, the vertex between the inclinations of the heat sink 15 can be freely determined.

Figure 4A:
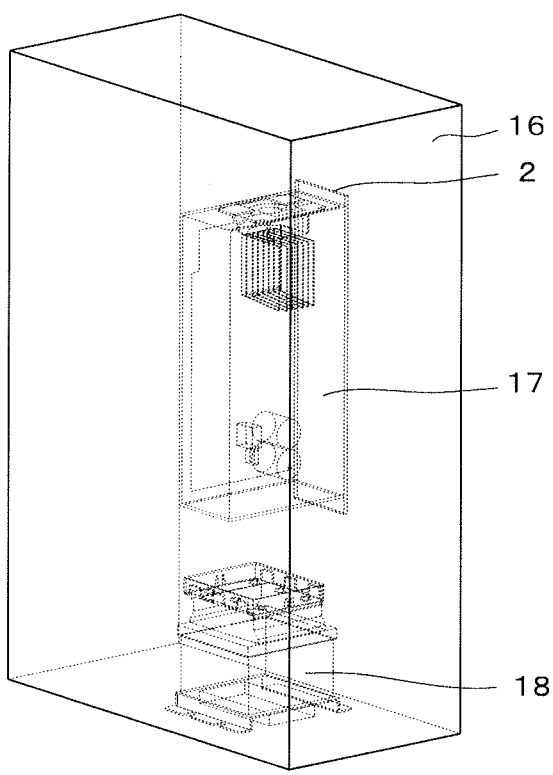
FIG. 4A is a schematic perspective view of Embodiment 4 of the motor drive unit according to the present invention in which a part of a housing of the motor drive unit is in contact with an electric cabinet.
Figure 4B:
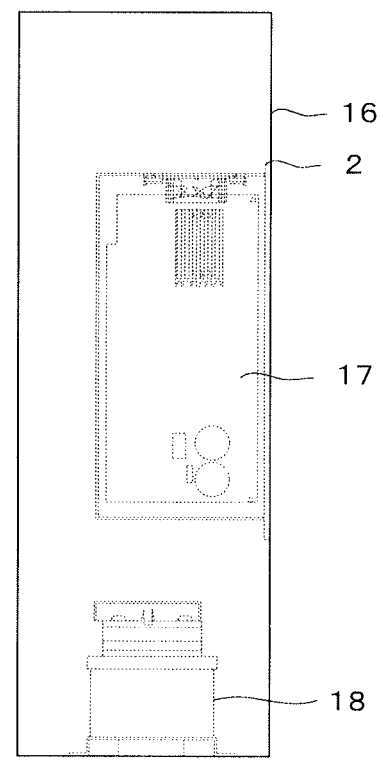
FIG. 4B is a schematic side view of the motor drive unit and an electric cabinet in FIG. 4A.
Figure 5A:
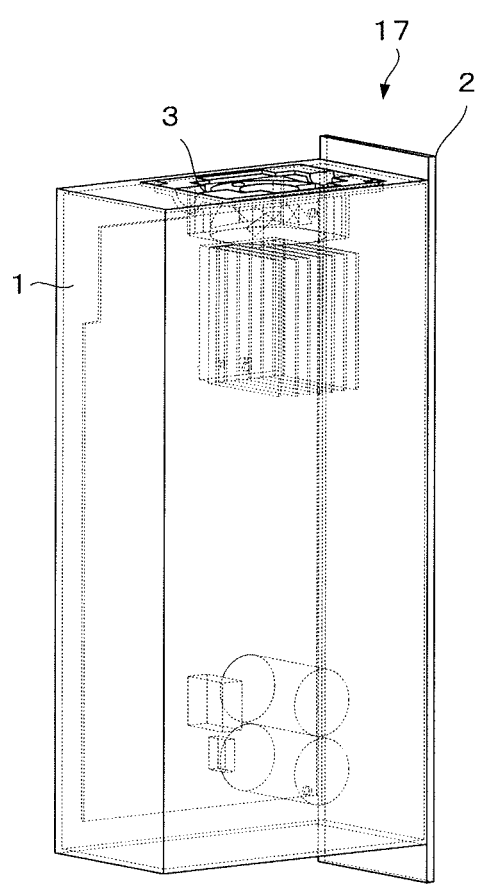
FIG. 5A is a perspective view of the appearance of a motor drive unit according to a conventional technique.
Figure 5B:
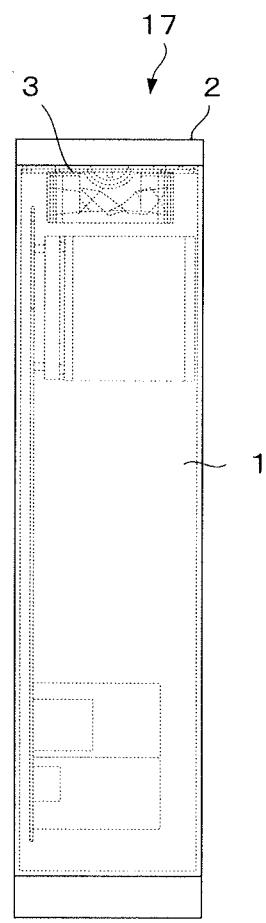
FIG. 5B is a side view of the appearance of the motor drive unit in FIG. 5A.
Figure 6A:
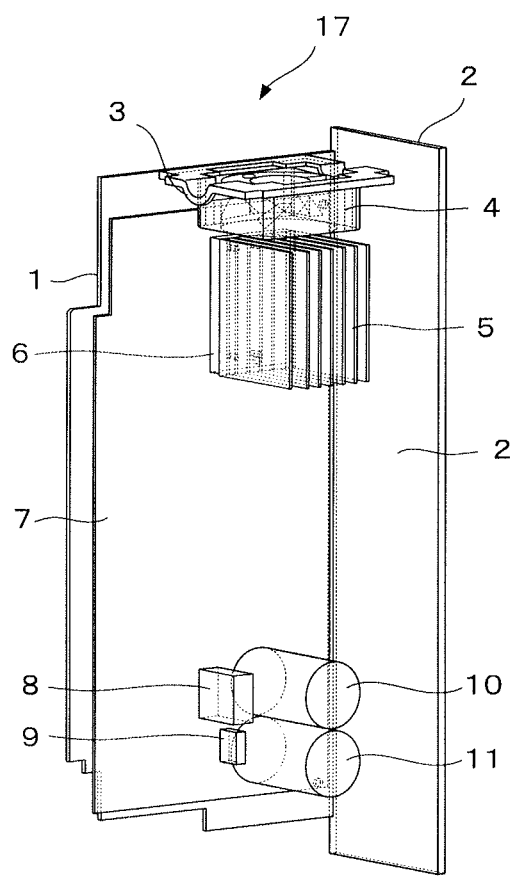
FIG. 6A is a schematic diagram of an internal configuration of the motor drive unit in FIG. 5A.
Figure 6B:
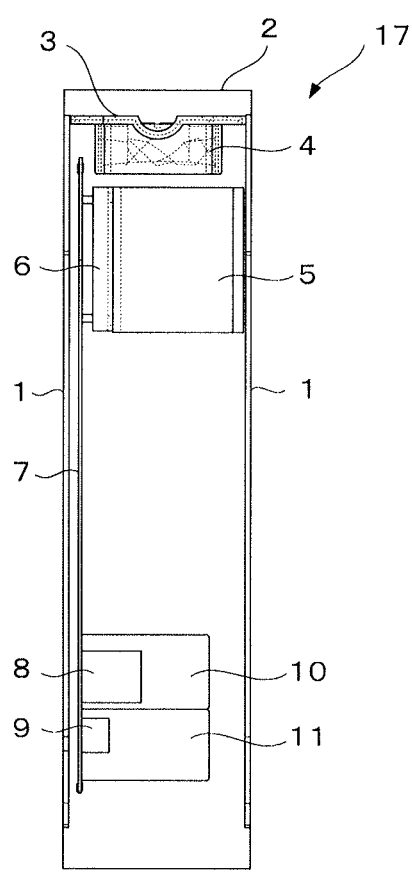
FIG. 6B is a schematic front view of the inside of the motor drive unit in FIG. 6A.

Now, Embodiment 4 of the motor drive unit according to the present invention will be described with reference to FIG. 4A and FIG. 4B.

In Embodiment 4, a part of a second housing component 2 of a motor drive unit 17 is in contact with an electric cabinet 16, and thus, droplets start to flow from a heat sink 12 down a first housing component 1 (not depicted in the drawings) in the motor drive unit 17 to the second housing component 2. The droplets then flow down the second housing component 2 to an electric cabinet 16 and down the electric cabinet 16. This enables a reduction in the adhesion of droplets to an electronic unit 18 mounted on a ground side of the motor drive unit 17.

The invention claimed is:

1. A motor drive unit comprising:

a housing;

at least one electronic component disposed within the housing;

a heat sink mounted to a mounting surface of the electronic component; and a fan motor for generating forced convection inside the housing, wherein the heat sink comprises a first end intersecting the mounting surface of the electronic component and inclined in a direction relative to a direction perpendicular to the mounting surface, a second end adjacent to the first end and opposite the mounting surface, the second end not directly facing the mounting surface, and a vertex defined between the first end and the second end of the heat sink, the vertex provided so as to prevent a cutting fluid dropping from the heat sink from falling onto another electronic component located below the heat sink, and wherein the convection generated by the fan motor is forced into the heat sink from the inclined first end of the heat sink toward the fan motor.

2. The motor drive unit according to claim 1, wherein the second end of the heat sink on the side opposite to the electronic component is in proximity to or in contact with the housing.

3. The motor drive unit according to claim 2, wherein a part of the housing is in contact with an electric cabinet.

* * * * *